United States Patent [19]

Botez

[11] 4,347,486

[45] Aug. 31, 1982

[54] SINGLE FILAMENT SEMICONDUCTOR LASER WITH LARGE EMITTING AREA

[75] Inventor: Dan Botez, Mount Holly, N.J.

[73] Assignee: RCA Corporation, New York, N.Y.

[21] Appl. No.: 251,651

[22] Filed: Apr. 6, 1981

Related U.S. Application Data

[63] Continuation-in-part of Ser. No. 84,387, Oct. 12, 1979, abandoned.

[51] Int. Cl.³ ................................................ H01S 3/19
[52] U.S. Cl. ........................................ 372/46; 357/17
[58] Field of Search .................... 331/94.5 H; 357/17, 357/18

[56] References Cited

U.S. PATENT DOCUMENTS

| | | | |
|---|---|---|---|
| 3,887,404 | 6/1975 | Chane | 156/8 |
| 3,978,428 | 8/1976 | Burnham et al. | 331/94.5 H |
| 3,983,510 | 9/1976 | Hayashi et al. | 331/94.5 H |
| 4,166,253 | 8/1979 | Small et al. | 331/94.5 H |
| 4,185,256 | 1/1980 | Scifres et al. | 331/94.5 H |
| 4,215,319 | 7/1980 | Botez | 331/94.5 |

OTHER PUBLICATIONS

Botez et al., "Constricted Double–Heterostructure (Al-Ga)As Diode Lasers", *Appl. Phys. Letters*, vol. 32, No. 4, Feb. 15, 1978, pp. 261–263.
Kressel et al., "Large Optical Cavity Lasers—Symmetrical and Asymetrical Structures", *Semiconductor Laser and Heterojunction LEDs*, Academic Press, 1977, pp. 230–234.
Scifres et al., Appl. Phys. Letters, vol. 32, No. 10, May 15, 1978, pp. 658–661.
Single-Mode CW Operation of "Double—Dovetail", Constricted DH (AlGa)As Diode Lasers, Appl. Phys. Letters, vol. 33, pp. 872–874, Nov. 15, 1978.

*Primary Examiner*—James W. Davie
*Attorney, Agent, or Firm*—Birgit E. Morris; Donald S. Cohen

[57] ABSTRACT

A body of a semiconductor material of a Group III-V compound or alloy of such compounds includes a substrate of one conductivity type with a pair of spaced, substantially parallel grooves in a surface thereof. Over the surface of the substrate and the grooves are, in sequence, a buffer epitaxial layer of the one conductivity type, a first confinement epitaxial layer of the one conductivity type, a guide epitaxial layer of the one conductivity type, an active epitaxial layer which is the active recombination layer, a second confinement epitaxial layer of the opposite conductivity type and a cap epitaxial layer of the opposite conductivity type. The epitaxial layers are of materials forming heterojunctions between the first confinement layer and the guide layer, and between the active layer and second confinement layer. The material of the active layer has an index of refraction larger than that of the materials of the first and second confinement layers, the material of the guide layer has an index of refraction less than that of the active layer but greater than that of each of the confinement layers. The guide layer and active layer have a region of uniform thickness directly over the space between the grooves.

20 Claims, 5 Drawing Figures

SINGLE FILAMENT SEMICONDUCTOR LASER WITH LARGE EMITTING AREA

The Government has rights in this invention pursuant to Contract No. MDA 904-79-C-0415.

BACKGROUND OF THE INVENTION

This is a continuation-in-part of my copending application Ser. No. 84,387, filed Oct. 12, 1979, entitled "SINGLE FILAMENT SEMICONDUCTOR LASER WITH LARGE EMITTING AREA (now abandoned)."

The present invention relates to a semiconductor laser which emits a single filament of light and particularly to such a semiconductor laser which emits a single filament of light of relatively large area.

There have been developed semiconductor lasers which include a body of semiconductor material, generally a Group III-V compound or alloy of such compounds, having a thin active region between regions of opposite conductivity type, i.e., a region of P type conductivity on one side of the active region and a region of N type conductivity on the other side of the active region. The active region is generally of a material which forms a heterojunction with each of the adjacent regions so that the light generated is substantially confined to the active region. Such a semiconductor laser is shown and described in U.S. Pat. No. 3,747,016 to H. Kressel et al., issued July 17, 1973 entitled "SEMICONDUCTOR INJECTION LASER." One problem encountered with this type of semiconductor laser is that it emits light of more than one optical mode, particularly in the direction along the plane of the PN junction. Thus, the emitted beam of light has a complex far-field radiation pattern and is limited in its use. Also, mode shifting with increasing drive current is undesirable for the uses of the laser in various practical applications.

Various semiconductor laser structures have been developed in an attempt to achieve a stable single optical mode filament of light. One structure of a semiconductor laser which successfully achieves this result is described in my U.S. Pat. No. 4,215,319, issued July 29, 1980, entitled "SINGLE FILAMENT SEMICONDUCTOR LASER" and in my article entitled "SINGLE-MODE CW OPERATION OF 'DOUBLE-DOVETAIL' CONSTRICTED DH (AlGa)As DIODE LASERS", *Applied Physics Letters*, Vol. 33, pgs. 872-874, Nov. 15, 1978.

In general, this semiconductor laser is a body of a semiconductor material of a Group III-V compound or alloy of such compound, which body includes a substrate of one conductivity type with a pair of spaced, substantially parallel, dove-tail shaped grooves in a surface thereof. Over the surface of the substrate and the grooves are, in sequence, a first epitaxial layer of the one conductivity type, a second epitaxial layer which is the active recombination layer, a third epitaxial layer of the opposite conductivity type and a fourth epitaxial layer of the opposite conductivity type. The first and third layers are of a material forming heterojunctions with the second active layer. The first epitaxial layer has a flat surface portion over the portion of the substrate surface between the grooves and the light is generated in the second active layer in the vicinity of the flat surface portion of the first epitaxial layer. A stripe contact is provided on the fourth layer directly over the flat surface portion of the first epitaxial layer. This semiconductor laser structure provides a stable single optical mode filament of light, although the mode size in the direction perpendicular to the active layer of the light emitted is relatively small, in the range of 0.5 to 0.6 micron. For certain applications, it would be desirable to have a semiconductor laser which provides a stable single optical mode filament of light, but of larger size.

SUMMARY OF THE INVENTION

A semiconductor laser includes a body of semiconductor material having a substrate with a pair of spaced, substantially parallel grooves in a surface thereof. A first confinement epitaxial layer is over the surface of the substrate and the surfaces of the grooves, the first confinement layer having a flat surface portion over the portion of the substrate surface between the grooves. A guide epitaxial layer is over the first confinement layer, a thin active epitaxial layer is over the guide layer and a second confinement epitaxial layer is over the active layer. The active layer is of a material which has an index of refraction larger than that of the materials of each of the first and second confinement layers and the guide layer is of a material having an index of refraction less than that of the active layer but larger than that of each of the first and second confinement layers. The first confinement layer and guide layer are of the same conductivity type and the second confinement layer is of the opposite conductivity type. The active layer is the active recombination region of the laser with the light being generated therein in the vicinity of the portion which is over the flat surface portion of the first confinement layer.

DETAILED DESCRIPTION OF THE INVENTION

Figure 1:
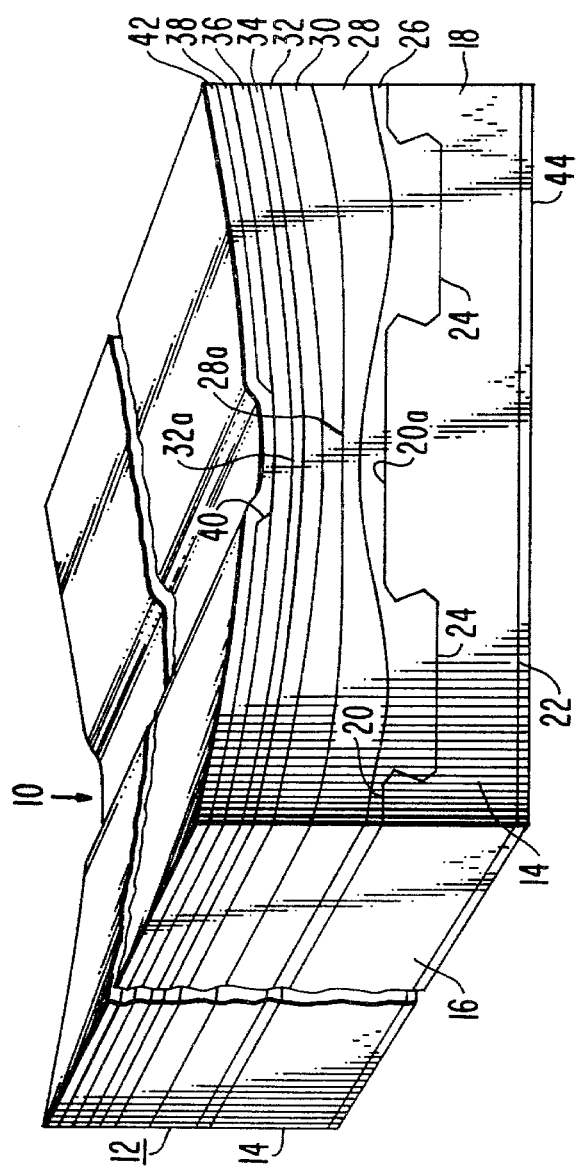
FIG. 1 is a perspective view of one form of a semiconductor laser incorporating the present invention.

Referring to FIG. 1, a form of a laser diode incorporating the present invention is generally designated as 10. The laser diode 10 comprises a body 12 of single crystalline semiconductor material, generally of the Group III-V compounds or alloys of such compounds, in the form of a parallelopiped. The body 12 has spaced parallel end surfaces 14 which are reflecting to light with at least one of the end surfaces 14 being partially transparent so that light will be emitted therefrom. The body 12 also includes spaced substantially parallel side surfaces 16 which extend between and are perpendicular to the end surfaces 14.

The body 12 is formed by a substrate 18 of one conductivity type, such as N type, having spaced parallel top and bottom surfaces 20 and 22 respectively which extend between and are perpendicular to both the end surfaces 14 and side surfaces 16 of the body 12. In the top surface 20 of the substrate 18 are a pair of spaced, parallel dove-tail shaped grooves 24 which extend between the end surfaces 14 of the body 12. The top corners of the grooves 24 are removed so that a portion of the sides of the grooves adjacent the top surface 20 taper away from each other. A buffer epitaxial layer 26 partially fills each of the grooves 24 and extends over the portion 20a of the surface 20 between the grooves 24, and the portions of the surface 20 on each side of the grooves 24. The buffer epitaxial layer 26 is of the same conductivity type as the substrate 18. A first confinement epitaxial layer 28 extends over the buffer layer 26 and has a flat surface portion 28a over the substrate surface portion 20a between the grooves 24. The first confinement layer 28 is of the same conductivity type as the buffer layer 26 and the substrate 18.

A guide epitaxial layer 30 extends over the first confinement layer 28. The guide layer 30 is of the same conductivity type as that of the first confinement layer 28. An active epitaxial layer 32 extends over the guide layer 30. The active layer 32 is thin and has a portion 32a of uniform thickness directly over the flat surface portion 28a of the first confinement layer 28. The active layer 32 is the active recombination region of the laser diode 10. Although the active layer 32 can be of either conductivity type, it is preferably of a material which is not intentionally doped.

A second confinement epitaxial layer 34 is over the active layer 32 and is of a conductivity type opposite to that of the first confinement and guide layers 28 and 30. Thus, if the first confinement and guide layers 28 and 30 are each of N type, the second confinement layer 34 is of P type. A cap epitaxial layer 36 of the same conductivity type as the second confinement layer 34 is over the second confinement layer 34. A layer 38 of an electrical insulating material, such as silicon dioxide, is on the cap layer 36 and has an opening 40 therethrough in the form of a stripe extending over and along the flat surface portion 28a of the first confinement layer 28. A conductive material contact 42 is over the insulating layer 38 and extends into the opening 40 in the insulating layer 38 to ohmically contact the surface of the cap layer 36. A conductive metal contact 44 is also on the bottom surface 22 of the substrate 18.

Figure 2:
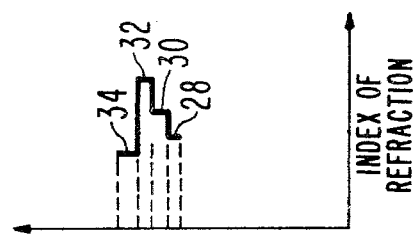
FIG. 2 is a diagram showing the relative indices of refraction of the various layers of the semiconductor laser shown in FIG. 1.

As shown in FIG. 2, the active layer 32, which is the active region, is of a material having an index of refraction greater than that of the materials of each of the first and second confinement layers 28 and 34. Although in the laser diode 10 shown, the material of the second confinement layer 34 has an index of refraction less than that of the first confinement layer 28, the first and second confinement layers 28 and 34 may be of the same material having the same index of refraction. The guide layer 30 is of a material having an index of refraction less than that of the material of the active layer 32 but greater than that of the material of each of the first and second confinement layers 28 and 34. Thus, there are provided heterojunctions between the first confinement and guide layers 28 and 30, between the guide layer 30 and active layer 32, and between the active layer 32 and second confinement layer 34.

One group of materials which can be used to make a laser diode 10 having the various layers with the above specified indices of refraction are gallium arsenide and aluminum gallium arsenide. For example, the active layer 32 can be of either gallium arsenide or $Al_zGa_{1-z}As$ where z is no greater than about 0.08. The active layer 32 should be of a thickness of about 0.05 to 0.2 microns. The guide layer 30 could then be of $Al_yGa_{1-y}As$ where y is between 0.1 and 0.25. The guide layer 30 should be about 1 to 2 microns in thickness. The first confinement layer 28 could then be of $Al_xGa_{1-x}As$ where x is between 0.2 and 0.35. The second confinement layer 34 could be of the same composition as the first confinement layer or could be of aluminum gallium arsenide having a slightly greater content of aluminum. The substrate 18 should be of a material which is readily available in substrate form and upon which the epitaxial layers can be easily grown. For epitaxial layers of gallium arsenide and aluminum gallium arsenide, the substrate 18 can be of gallium arsenide. The buffer layer 26 is also of gallium arsenide and serves to provide a good surface on which the other layers are deposited. The cap epitaxial layer 36 is to protect the second confinement layer 34 and can be of gallium arsenide.

Figure 3:
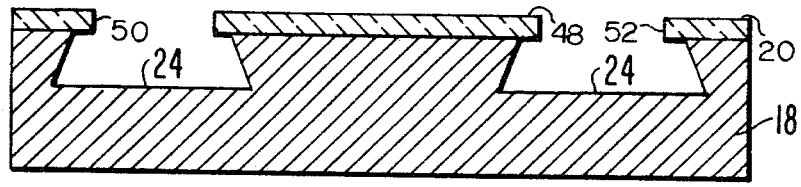
FIG. 3 is a sectional view showing the forming of the substrate for the semiconductor laser of the present invention.

Referring to FIG. 3 the laser diode 10 is made by starting with a substrate 18 of the desired semiconductor material and conductivity type, such as N type gallium arsenide, having a top surface 20 which is almost parallel to the (100) crystallographic plane and slightly misoriented (up to about 3°) along the [011] crystallographic direction with respect to the (100) crystallographic plane. A masking layer 48, such as silicon dioxide, is coated over the top surface 20 of the substrate 18. The silicon dioxide layer 48 may be deposited by the well-known technique of pyrolytically decomposing a silicon containing gas, such as silane, in oxygen or water vapor. A pair of spaced, parallel, stripe-like openings 50 and 52 are formed in the masking layer 48. This can be achieved by coating the masking layer 48 with a layer of a photoresist (not shown) and providing the photoresist with openings corresponding to the openings 50 and 52 using standard photolithographic techniques. The exposed portions of the masking layer 48 can then be removed with a suitable etchant, such as buffered HF, to form the openings 50 and 52. The photoresist is then removed with a suitable solvent. The openings 50 and 52 should be arranged to extend parallel to the [011] crystallographic direction of the substrate 18 which extends to the surface 20. For reasons which will be explained later, it is preferable that each of the openings 50 and 52 be about 4 to 6 microns wide and that the center-to-center spacing between the openings 50 and 52 should be between 20 microns and 45 microns.

The portions of the surface 20 of the substrate 18 which are exposed through the openings 50 and 52 are then contacted with an etchant which will selectively etch [100] oriented surfaces, vs. [111] oriented surfaces such as a solution of 1 part of sulfuric acid, 8 parts of water and 8 parts of hydrogen peroxide. As shown in FIG. 3, this results in the dove-tail shaped grooves 24 having a depth of about 4 microns and the (100) and (111) A planes as bottoms and sides respectively. The sides of the grooves 24 will be etched back under the masking layer 48 so that starting with openings 50 and 52 which are between 4 and 6 microns wide, the grooves 24 will be about 10 to 12 microns wide at their top edge when $\simeq 4\mu$ deep channels are desired. The silicon dioxide masking layer 48 is then removed with buffered HF.

The top surface 20 of the substrate 18 is then cleaned to assure good epitaxial growth of the various epitaxial layers of the laser diode 10. This may be achieved by slightly etching the surface 20 with a 1 to 1 mixture of aqueous sodium hydroxide (8 grams of sodium hydroxide to 200 ml. of water) and aqueous hydrogen peroxide (20 ml. of 30% hydrogen peroxide to 200 ml. of water) at 30° C. for about one minute. The substrate 18 is then placed in hot hydrofluoric acid to remove any oxides which may have formed on the top surface 20 and is then again slightly etched in the above-described mixture at 30° for ½ minute. The substrate 18 is then washed in water and dipped in isopropyl alcohol. The substrate 18 is then ready to have the various epitaxial layers deposited thereon.

The various epitaxial layers are deposited on the substrate 18 by the well-known technique of liquid phase epitaxy using a deposition apparatus such as shown and described in U.S. Pat. No. 3,753,801 to H. F. Lockwood et al. entitled "METHOD OF DEPOSITING EPITAXIAL SEMICONDUCTOR LAYERS FROM THE LIQUID PHASE" issued Aug. 21, 1973. In general, this apparatus includes a furnace boat having a plurality of spaced wells therein, one for each epitaxial layer to be deposited, and a slide movable longitudinally through the boat and across the bottom of each of the wells. The slide contains a pair of spaced recesses in its surface which extend into each of the wells. One of the recesses is adapted to carry a source wafer and the other recess is adapted to carry the substrate on which the epitaxial layers are to be deposited. In each of the wells is a charge of the semiconductor material to be deposited, a solvent for the semiconductor material, and a conductivity modifier, if one is to be used. In each of the wells over the charge is a weight for spreading out the deposition solution across the entire area of the well. If desired, a source wafer may be provided between the weight and the charge. In making the laser diode 10 it is preferable to have in at least the first well a source wafer between the weight and the charge.

In making the laser diode 10 a boat having at least six wells is used. The first well has therein a charge of gallium arsenide as the semiconductor material, gallium as the solvent and tin as the N type conductivity modifier, with a source wafer of gallium arsenide over the charge. The second well includes a charge of gallium arsenide and aluminum arsenide as the semiconductor material, gallium as the solvent, and tin as the conductivity modifier. The third well includes a charge of gallium arsenide and aluminum arsenide as the semiconductor material, gallium as the solvent, and tin as the conductivity modifier. The charge in the third well contains less aluminum arsenide than is contained in the charge in the second well. The fourth well contains a charge of gallium arsenide and possibly some aluminum arsenide as the semiconductor material, and gallium as the solvent, but no conductivity modifier. The fifth well includes a charge of gallium arsenide and aluminum arsenide as the semiconductor material, gallium as the solvent and germanium as the P type conductivity modifier. The sixth well contains a charge of gallium arsenide as the semiconductor material, gallium as the solvent and germanium as the P type conductivity modifier. The source wafer in the recess in the slide is of gallium arsenide. The substrate 18 having the grooves 24 therein is mounted in its appropriate recess in the slide with the grooves 24 extending parallel to the longitudinal movement of the slide.

The furnace boat with the charges and the wafer therein is placed in a furnace tube and a flow of high purity hydrogen is provided through the furnace tube and over the furnace boat. The furnace tube is heated to heat the contents of the furance boat to a temperature of between about 820° C. and 860° C. This causes the solvent to melt and the semiconductor materials and conductivity modifiers to dissolve in the molten solvent. This temperature is maintained long enough to insure complete melting and homogenization of the ingredients of the charges. The furnace boat and its contents are then permitted to cool about 3° C.–5° C. and the slide is moved to carry the substrate 18 directly into the solution in the first well.

Figure 4:
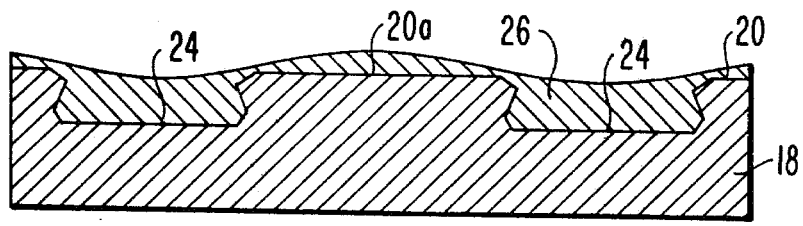
FIG. 4 is a sectional view showing the deposition of the first epitaxial layer on the substrate.

The source wafer in the slide passes through the first well without stopping and enters the second well when the substrate is brought into the first well. The source wafer between the weight and the solution in the first well is used to saturate the solution in the first well. When the top surface 20 of the substrate 18 is brought into contact with the solution in the first well there will occur a partial melt back of the top corners of the grooves 24 as shown in FIG. 4. The furnace boat and its contents are then cooled at a relatively fast rate, at least about 1° C. per minute. This will cause some of the semiconductor material in the solution in the first well and some of the conductivity modifier to precipitate out of the solution and deposit in the grooves 24 and on the top surface 20 of the substrate 18 to form the buffer layer 26 as shown in FIG. 4. The portion 26a of the surface of the buffer layer 26 over the substrate surface portion 20a between the grooves 24 should be substantially flat.

While the buffer layer 26 is being deposited on the substrate 18, the source wafer on the slide is in the second well and is saturating the solution in the second well. After the buffer layer 26 of the desired thickness is deposited on the substrate 18 the slide is moved to carry the substrate into the second well where the buffer layer 26 is brought into contact with the solution in the second well. The furnace boat and its contents are cooled further to cause some of the semiconductor material solution in the second well to precipitate out and deposit on the buffer layer 26 to form the first confinement layer 28. The first confinement layer 28 will have a flat surface portion 28a directly over but wider than the flat surface portion 26a of the buffer layer 26.

The slide is then moved to carry the substrate 18 into the third well where the first confinement layer 28 is brought into contact with the solution in the third well. The furnace boat and its contents are cooled further to cause some of the semiconductor material solution in the third well to precipitate out and deposit on the first confinement layer 28 to form the guide layer 30. The slide is then moved to carry the substrate 18 into the fourth well where the guide epitaxial layer 30 is brought into contact with the solution in the fourth well. The furnace boat and its contents are cooled further to cause the deposition of the active layer 32. The deposition of the semiconductor material from the solution in the fourth well is carried out for only a short period of time so as to provide the desired thin active region. To achieve the thin active layer 32 it is preferable to use a solution of small volume, as described in U.S. Pat. No. 3,753,801, so as to reduce the criticality of the time of deposition.

It is known that in liquid phase epitaxy the deposition rate will vary with surface curvature. The greater the amount of positive curvature, (i.e., concavity), the faster the deposition rate. Epitaxial growth will occur preferentially at the bottom of the two wells formed by the top surface of the buffer layer 26 above the two grooves 24. In turn, above the flat portion of the top surface of the buffer layer 26 the growth is reduced due both to the surface's large amount of negative curvature as well as to the lateral mass transfer of grown material toward regions of enhanced growth (i.e., towards the two concave parts of the top surface of the first epitaxial layer 26, which are placed above the grooves 24). Thus, the portion 28a of the first confinement layer 28 is of relatively uniform thickness over the surface portion 20a of the substrate and tapers in increasing thickness as the first confinement layer 28 passes around the corners of the grooves 24. Similarly, each of the guide layer 30 and active layer 32 has a portion of substantially uniform thickness over the flat surface portion 28a of the first confinement layer 28 and taper in thickness as they pass around the corners of the grooves 24. Although the tapering of the active layer 32 may be the same as that of the guide layer 30, generally the tapers of the two layers are different.

After the active layer 32 is deposited, the slide is moved to bring the substrate 18 into each of the fifth and sixth wells in succession. While the substrate is in each of the wells the temperature of the furnace boat and its contents is reduced further so as to precipitate from the solution in the particular well some of the semiconductor material and the conductivity modifier. This forms the second confinement layer 34 on the active layer 32 and the cap layer 36 on the second confinement layer 34. Each time that the slide is removed to bring the substrate 18 into a well, the source wafer on the slide will be in the next well where it saturates the solution in the next well. Thus, when the substrate is brought into a well, the solution in the well will be saturated with the semiconductor material to achieve effective deposition of the semiconductor material from the solution.

The substrate 18 with the epitaxial layers thereon is then removed from the furnace boat and the silicon dioxide insulating layer 38 is deposited over the sixth epitaxial layer 36. This is preferably achieved by pyrolitically decomposing a gas containing silicon, such as silane, in oxygen or water vapor. The stripe shaped opening 40 is provided in the silicon dioxide layer 38 by applying a photoresist (not shown) over the silicon dioxide layer 38 except for the portion where the opening 40 is to be formed. The exposed portion of the silicon dioxide layer 38 is then removed, such as by etching. The metal contact 42 is then coated over the silicon dioxide layer 38 and the exposed portion of the surface of the cap layer 36. This is generally achieved by the well-known technique of evaporation in a vacuum. Using this same technique, the metal contact 44 is coated on the bottom surface 22 of the substrate 18.

In the operation of the semiconductor laser 10 a current of threshold value across the laser 10 between the contacts 42 and 44 causes electrons and holes to be injected into the thin active region, i.e., the active layer 32, where the electrons and holes recombine to generate light. Lasing occurs in the portion of the active region of uniform thickness which is directly over the flat portion 28a of the surface of the first confinement layer 28 which is over the substrate surface 20a between the grooves 24. Also, the light emitted from the semiconductor laser 10 is a single mode filament both spatially (transverse and lateral) and longitudinally (i.e. in frequency). This single mode lasing is achieved even when operating the semiconductor laser 10 at CW and either room temperature or 70° C.

Since the difference in the indices of refraction of the guide layer 30 and the active layer 32 is small, the light generated in the active layer 32 will spread out into the guide layer 30. The light is then confined in the guide layer 30 and the active layer 32 by the heterojunctions between the confinement layer 28 and the guide layer 30 and between the active layer 32 and second confinement layer 34. Although the light will propagate in the active layer 32 and obtain its optical gain from the active layer 32, the light will (mostly) propagate in the guide layer 30 which is thicker than the active layer 32. This results in the beam of light emitted from the laser 10 being relatively wide in the transverse direction, about 2 microns as compared to 0.5–0.6 micron, in diodes of the same structure but without the guide layer 30. At the same time the beam has a relatively low divergence angle, 20° to 30°. Also, the single mode selectivity will be determined to a large extent by the shape of the guide layer 30 rather than by the shape of the active layer 32. The width of the lasing region is controlled mainly by guiding effect as well as to some extent a mode gain selectivity effect achieved by the guide layer 30 and to some extent the active layer 32, tapering in thickness in each direction from the portion of uniform thickness which is over the flat surface portion 28a of the first confinement layer 28.

Figure 5:
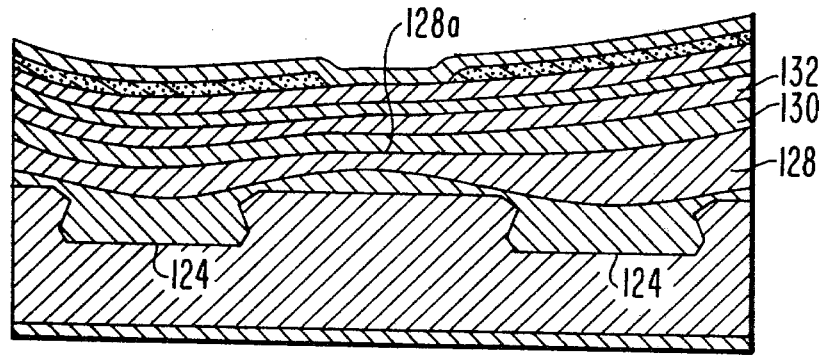
FIG. 5 is a sectional view of another form of a semiconductor laser incorporating the present invention.

Although the misorientation of the top surface 20 of the substrate 18 has been described as being parallel to the longitudinal axis of the groove 24, it may be desirable to have the direction of misorientation be at an angle of between about 45° and 135° with respect to the longitudinal axis of the groove 24. As previously described, with the misorientation being parallel to the groove 24, the portion of the guide layer 30 and active layer 32 which are over the flat surface portion 28a of the first confinement layer 28 is symmetrical, i.e., the tapering is generally substantially uniform at each side of the region of uniform thickness. However, as shown in FIG. 5, if the misorientation is not parallel to the grooves 124 the portions of the guide layer 130 and active layer 132 which are over the flat portion 128a of the surface of the first confinement layer 128 are not symmetrical since the tapering at one side will be greater than at the other side. This nonsymmetry becomes sufficient to affect the operation of the semiconductor laser when the misorientation is at an angle of at least about 45° with respect to the longitudinal axis of the groove 124. The effect of this nonsymmetry is that the spot of light generated in the active layer 132 is larger than the spot of light generated in the symmetrical layer. However, whether the portions of the guide layer and active layers are symmetrical or nonsymmetrical, the lasing occurs in this region which is directly over the flat portion of the surface of the first confinement layer.

Although the laser diode 10 has been shown and described as including dove-tail shaped grooves 24 in the top surface 20 of the substrate 18, which shape is preferred for ease of making the laser diode 10, the grooves 24 can be of other shapes, such as V, U or square shape. No matter what shape grooves are used, the various layers of the diode 10 should be deposited on the substrate so as to provide the guide layer 30 with portions which taper in directions away from the portion over the flat surface portion 28a of the first confinement layer 28, and the active layer 32 with a region over the flat surface of the first confinement layer 28 in which the light is generated.

We claim:
1. A semiconductor laser comprising:
a body of semiconductor material including a substrate having a surface and a pair of spaced substan- tially parallel dove-tail shaped grooves in said surface, said body having a pair of end surfaces between which said grooves extend, said end surfaces being reflective to light with at least one of said end surfaces being partially transparent to light, a first confinement epitaxial layer over said surface of the substrate and the surfaces of the grooves, said first confinement layer having a flat surface portion over the portion of the substrate between the grooves, a guide epitaxial layer over said first confinement layer, a thin active epitaxial layer over said guide layer, a second confinement epitaxial layer over said active layer, said first confinement layer and guide layer being of one conductivity type and the second confinement layer being of the opposite conductivity type, the active layer being of a material having an index of refraction greater than that of the materials of the first and second confinement layers and the guide layer being of a material having an index of refraction less than that of the material of the active layer but greater than that of the material of each of the first and second confinement layers, the active layer being the recombination region of the laser with the light being generated therein in the vicinity of the portion which is over the flat surface portion of the first confinement layer, and conductive contacts on said body at opposite sides of the active layer.

2. A semiconductor laser in accordance with claim 1 in which the epitaxial layers are of materials which form heterojunctions between adjacent layers.

3. A semiconductor laser in accordance with claim 2 in which each of said guide layer and active layer has a portion which tapers in thickness away from a portion of said layers which is of uniform thickness and is directly over the flat surface portion of said first confinement layer.

4. A semiconductor laser in accordance with claim 3 in which each of the guide layer and active layer tapers in increasing thickness in each direction from said section of uniform thickness.

5. A semiconductor laser in accordance with claim 3 in which the tapering portions are symmetrical.

6. A semiconductor laser in accordance with claim 3 in which the tapering portions are nonsymmetrical.

7. A semiconductor laser in accordance with claim 3 in which the corners of each of the grooves at said substrate surface are removed so that a portion of the sides of each groove adjacent said surface taper away from each other.

8. A semiconductor laser in accordance with claim 3 including a cap epitaxial layer on said second confinement layer and of the same conductivity type as the second confinement layer.

9. A semiconductor laser in accordance with claim 8 including a buffer epitaxial layer between the substrate and the first confinement layer, said buffer layer being of the same material and conductivity type as the substrate.

10. A semiconductor laser in accordance with claim 9 in which one of said conductive contacts is over said cap layer and engages said cap layer along a stripe which is over and extends along the portion of the active layer of uniform thickness.

11. A semiconductor laser in accordance with claim 9 including a layer of an electrical insulating material on and covering said cap layer, said insulating layer having an opening therethrough to expose a stripe of the surface of the cap layer which extends along the portion of the active layer of uniform thickness and a conductive contact on the insulating layer and the exposed surface of the cap layer.

12. A semiconductor laser in accordance with claim 11 in which the other conductive contact is on a surface of the substrate which is opposed to and spaced from the surface having the grooves therein.

13. A semiconductor laser comprising:

a parallelopiped body of semiconductor material having spaced, parallel end surfaces and spaced, parallel side surfaces extending between said end surfaces, said end surfaces being reflective to light with at least one of said end surfaces being partially transparent to light, said body including a substrate having a surface which extends between said end and side surfaces of said body and a pair of spaced, substantially parallel dove-tail shaped grooves in said substrate surface, said grooves extending between said body end surfaces, a first confinement epitaxial layer over said surface of the substrate and the surfaces of the grooves, said first confinement layer having a flat surface portion over the portion of the substrate between the grooves, a guide epitaxial layer over said first confinement layer, a thin active epitaxial layer over said guide layer, each of said guide layer and active layer having a portion of uniform thickness over the flat surface portion of the first confinement layer and tapering in thickness in each direction from the portion of uniform thickness, the active layer being the recombination region of the laser with the light being generated therein in the vicinity of the portion of uniform thickness, a second confinement epitaxial layer over said active layer, a cap epitaxial layer over said second confinement layer, each of said epitaxial layers being of a material which forms a heterojunction between adjacent layers, said first confinement layer and guide layer being of one conductivity type and the second confinement layer and cap layer being of the opposite conductivity type, the active layer being of a material having an index of refraction greater than that of the materials of the first and second confinement layers and the guide layer being of a material having an index of refraction less than that of the material of the active layer but greater than that of the materials of each of the first and second confinement layers, a first conductive contact over said cap layer and engaging said cap layer along a stripe which is over the position of uniform thickness of the active layer and extending between the end surfaces of the body, and a second conductive contact on a surface of the substrate which is opposite to and spaced from the surface containing the grooves.

14. A semiconductor laser in accordance with claim 13 in which the corners of each of the grooves at said substrate surface are removed so that a portion of the sides of each groove adjacent each surface taper away from each other.

15. A semiconductor laser in accordance with claim 14 including a layer of electrical insulating material on and covering said cap layer, said insulating layer having an opening therethrough to expose a stripe of the surface of the cap layer which extends along the portion of the active layer of uniform thickness, and the first conductive contact is on the insulating layer and the exposed surface of the cap layer.

16. A semiconductor laser in accordance with claim 15 including a buffer epitaxial layer between the first confinement layer and the surface of the substrate, said buffer layer being of the same material and conductivity type as the substrate.

17. A semiconductor laser in accordance with claim 16 in which the substrate, buffer layer and the cap layer are of gallium arsenide and the other layers are of aluminum gallium arsenide.

18. A semiconductor laser comprising:
a body of semiconductor material including a substrate having a surface and a pair of spaced substantially parallel grooves in said surface, said body having a pair of end surfaces between which said grooves extend, said end surfaces being reflective to light with at least one of said end surfaces being partially transparent to light,
a first confinement epitaxial layer over said surface of the substrate and the surfaces of the grooves, said first confinement layer having a flat surface portion over the portion of the substrate between the grooves,
a guide epitaxial layer over said first confinement layer,
a thin active epitaxial layer over said guide layer,
a second confinement epitaxial layer over said active layer,
said first confinement layer and guide layer being of one conductivity type and the second confinement layer being of the opposite conductivity type,
the active layer being of a material having an index of refraction greater than that of the materials of the first and second confinement layers and the guide layer being of a material having an index of refraction less than that of the material of the active layer but greater than that of the material of each of the first and second confinement layers,
the active layer being the recombination region of the laser with the light being generated therein in the vicinity of the portion which is over the flat surface portion of the first confinement layer, and
conductive contacts on said body at opposite sides of the active layer.

19. A semiconductor laser in accordance with claim 18 in which the epitaxial layers are of materials which form heterojunctions between adjacent layers.

20. A semiconductor laser in accordance with claim 19 in which each of said guide layer and active layer has a portion which tapers in thickness away from a portion of said layers which is of uniform thickness and is directly over the flat surface portion of said first confinement layer.

* * * * *